United States Patent
Lipp et al.

(10) Patent No.: US 9,602,031 B2
(45) Date of Patent: Mar. 21, 2017

(54) ELECTRONIC CIRCUIT AND METHOD FOR TRIGGERING A SEMICONDUCTOR SWITCH

(75) Inventors: Helmut Lipp, Dörzbach-Hohebach (DE); Ralph Wystup, Künzelsau (DE); Fabian Schneider, Rot am See (DE); Sebastian Schroth, Kupferzell (DE)

(73) Assignee: ebm-papst Mulfingen GmbH & Co. KG, Mulfingen (DE)

( * ) Notice: Subject to any disclaimer, the term of this patent is extended or adjusted under 35 U.S.C. 154(b) by 31 days.

(21) Appl. No.: 14/355,722

(22) PCT Filed: Nov. 24, 2011

(86) PCT No.: PCT/EP2011/070988
§ 371 (c)(1),
(2), (4) Date: May 1, 2014

(87) PCT Pub. No.: WO2013/075749
PCT Pub. Date: May 30, 2013

(65) Prior Publication Data
US 2014/0312817 A1    Oct. 23, 2014

(51) Int. Cl.
  *H02P 6/14*     (2016.01)
  *H03K 17/16*    (2006.01)
  (Continued)

(52) U.S. Cl.
  CPC .............. *H02P 6/14* (2013.01); *H03K 17/166* (2013.01); *H02P 6/085* (2013.01); *H02P 27/06* (2013.01); *Y02T 10/7005* (2013.01)

(58) Field of Classification Search
  CPC .......... H02P 6/085; H02P 27/06; H02P 6/003; H02P 6/06; Y02T 10/7005
  (Continued)

(56) References Cited

U.S. PATENT DOCUMENTS

| 5,801,458 A * | 9/1998 | Marks ........................... 307/131 |
| 2008/0266915 A1* | 10/2008 | Eckardt ................. H02M 5/458 363/65 |

(Continued)

FOREIGN PATENT DOCUMENTS

WO    WO-2008/032113 A1    3/2008

OTHER PUBLICATIONS

International Search Report for PCT/EP2011/070988, ISA/EP, Rijswijk, NL, mailed Oct. 5, 2012.
(Continued)

*Primary Examiner* — Kawing Chan
*Assistant Examiner* — Bradley Brown
(74) *Attorney, Agent, or Firm* — Harness, Dickey & Pierce, P.L.C.

(57) ABSTRACT

An electronic circuit comprises at least one semiconductor switch mounted with its switching path in series with an inductive load to be triggered, and at least one freewheeling element that interacts with the semiconductor switch during switching phases and is also mounted in series with the load. A control unit controls a control connection of the semiconductor switch with a variable control current as a function of the time profile of a voltage measured at the freewheeling element and/or as a function of the time profile of the voltage measured at the switching path. A method for triggering a semiconductor switch of such a circuit, triggered by a variable control current for switching, the control current predefined as a function of the time profile of a voltage measured at the freewheeling element and/or as a function of the time profile of the voltage measured at the switching path.

9 Claims, 10 Drawing Sheets

(51) Int. Cl.
*H02P 6/08* (2016.01)
*H02P 27/06* (2006.01)

(58) Field of Classification Search
USPC .................................................. 318/400.27
See application file for complete search history.

(56) References Cited

U.S. PATENT DOCUMENTS

2010/0060326 A1* 3/2010 Palmer ............. H03K 17/08148
327/109
2010/0315027 A1* 12/2010 Wystup ................... H02P 6/085
318/400.3

OTHER PUBLICATIONS

Written Opinion of the ISA for PCT/EP2011/070988, ISA/EP, Rijswijk, NL, mailed Oct. 5, 2012.

* cited by examiner

ELECTRONIC CIRCUIT AND METHOD FOR TRIGGERING A SEMICONDUCTOR SWITCH

CROSS-REFERENCE TO RELATED APPLICATIONS

This application is a 371 U.S. National Stage of International Application No. PCT/EP2011/070988, filed Nov. 24, 2011, the entire disclosure of which is incorporated by reference herein.

FIELD

The present disclosure relates firstly to an electronic circuit in particular as part of an electronic inverter circuit preferably to operate EC motors, the circuit having at least one semiconductor switch, the switching path of which is in series with an inductive load to be controlled and at least one freewheeling element that interacts with the semiconductor switch during switching phases and is also in series with the load.

Furthermore, the disclosure also relates to a novel method for controlling a semiconductor switch, which, in such a circuit, is in series, with its switching path, with an inductive load to be controlled and which interacts during switching phases with a freewheeling element also in series with the load.

BACKGROUND

When switching inductive loads, such as in particular electrically recommutating the current flow of the winding(s) of EC motors, as a rule modern power semiconductor devices are used as semiconductor switches in combination with freewheeling elements, as a rule freewheeling diodes, which are parallel thereto. Power transistors such as MOSFETs or IGBTs are usual.

The semiconductor switch or switches is/are each controlled to switch or recommutate via their control connection using control signals, which are usually generated by a micro controller and then fed to a driver circuit, which then switches the respective semiconductor switch on or off.

In order to keep switching losses of power semiconductors to a minimum it is known to switch power conductors on and off as quickly as possible. Less power loss is achieved by this measure and cooling means can be kept accordingly small.

A disadvantage with switching inductive loads on and off rapidly is that, as a result of the steep edges when switching a power transistor, interference voltages are generated, which have to be suppressed again using so-called EMC filters.

The interference spectrum, the so-called EMC interference, forms as high-frequency interference when the power semiconductor is switched on and off. The limit value of such interference spectra are defined in certain EN standards and may not be exceeded. Therefore in many cases in practice it is necessary to construct costly, large-volume EMC filters, which require a lot of installation space and cause high costs. EMC filters are normally passive components, usually a combination of inductivity and capacity.

SUMMARY

The object of the present disclosure is to prevent or at least minimise high frequency interference whilst guaranteeing minimal switching losses by switching the respective semiconductor on and off as rapidly as possible without costly EMC filters. In other words interference spectra are to be prevented at the switch edges with minimal power loss in order to be able to save on EMC components.

The disclosure is accordingly characterised by a novel control unit, a control connection of the semiconductor switch being controlled with a variable control current as a function of the time profile of a voltage measured at the associated freewheeling element. By means of this measure according to the disclosure, the profile of the respective switch edge can be modulated at the upper region. In addition, or even alternatively, the control unit is designed such that it controls the semiconductor switch with a variable control current as a function of the time profile of the voltage measured at the switching path of the semiconductor switch. By means of this measure the respective switch edge can be modulated in its lower region. By means of both measures a dB spectral reduction is achieved.

In a preferred embodiment, both measures are combined with each other in that the control unit measures on the one hand the voltage at the freewheeling element as well as on the other hand the voltage at the switching path of the semiconductor switch to be controlled, the function of the current flow being changed by a switching member from one voltage to the other voltage at a certain ratio of the two measured voltages during the switching phases. In this way the switch edges can be modulated advantageously both in the lower and upper regions in order to prevent or at least reduce interference spectra.

FIGURES

The disclosure is described in more detail by way of examples with reference to the following description and drawings, in which.

In the various figures of the drawings the same parts are always given the same reference numerals.

DESCRIPTION

With regard to the following description it is expressly emphasised that the disclosure is not restricted to the embodiments and in the process not to all or more than one feature of described combinations of features, but rather each individual sub-feature of the/each embodiment can also have an inventive significance per se detached from all other sub-features described in conjunction therewith and also in combination with any of the features of another embodiment as well as independently of the combinations of features and back references of the claims.

Figure 1:
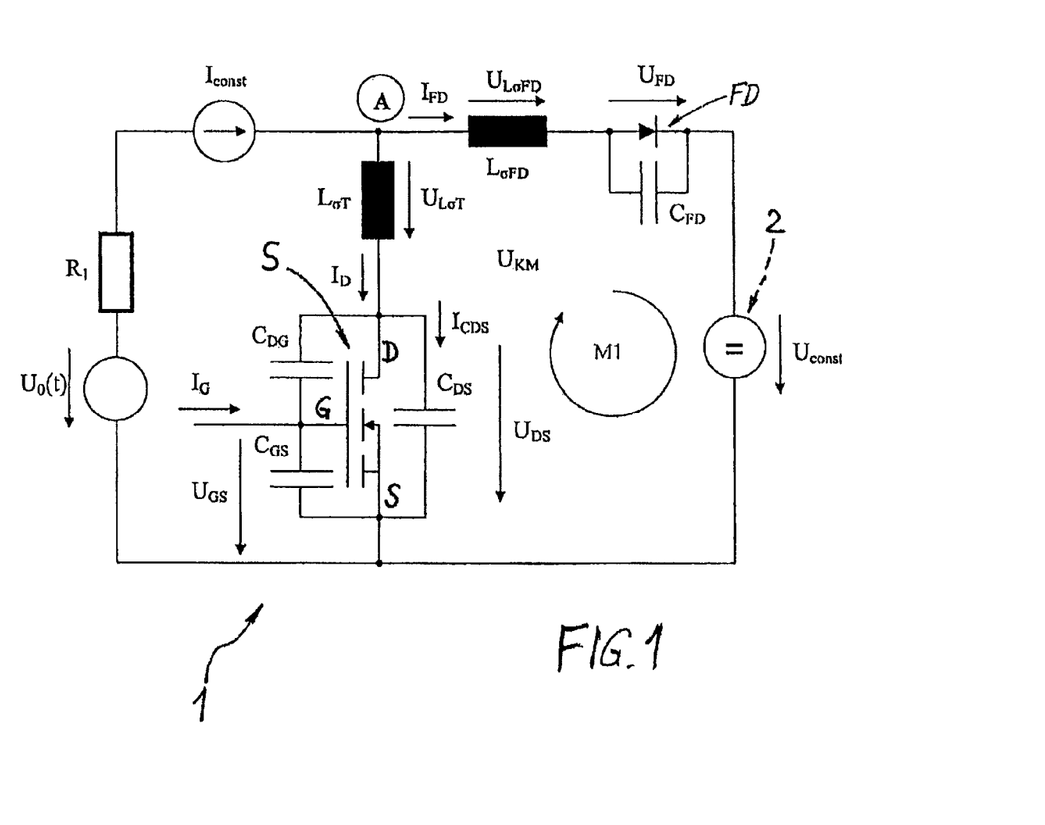
FIG. 1 shows an equivalent circuit diagram of a circuit according to the disclosure.

In FIG. 1 a circuit 1 according to the disclosure is shown as an equivalent circuit diagram and specifically in a minimal embodiment as a so-called "elementary switching unit". In a constant $$P = \frac{U_{const}}{T} \cdot \int_T I_{FD}(t) \cdot dt$$

voltage source $U_{const}$ the effective power is transformed.

As a result of the current direction through a freewheeling diode FD that is possible here, the effective power is taken from the system, which is synonymous with the behaviour of a load 2.

Because of the current direction, the constant current source $I_{const}$ here represents a power source in that it emulates the behaviour of an inductive reactance during the switching process. The voltage $U_0(t)$ can be selected at will, as can the resistance $R_1$. The semiconductor switch S is shown with its parasitic capacitances.

Because parasitic elements $L_{\sigma FD}$, $L_{\sigma T}$ are also more or less strongly pronounced according to the switching process, the freewheeling element, here the diode FD, is always in series with the load 2 or $U_{const}$, which can be seen by the sketched mesh Ml. In the process, the parasitic elements $L_{\sigma FD}$, $L_{\sigma T}$ can be assigned to any section of conductor. The parasitic capacitance $C_{FD}$ is part of the freewheeling diode FD and cannot be separated therefrom. The same applies to the three parasitic capacitances of the transistor S, which have been drawn here. The series connection described here, as is generally known, is characterised in that the same current flows through the freewheeling element FD, the load 2 and the parasitic elements as well as in parts of the associated switching means S, here the transistor. 'In parts' means taking Kirchhoff's current law into consideration at point A in FIG. 1.

On the basis of this "elementary switching unit" according to FIG. 1, the practical implementation of a control method according to the disclosure to control a semiconductor switch will now be shown.

Concept of a Control Model for the Reduction of the Stimulation of Vibrations During the Switching Process and for Creating Special Pulse Forms On the basis of the existing influence factors on the stimulation of parasitic vibrations triggered by switching the transistor, a control proposal is presented hereinafter for the given circuit topology.

A novelty in the process is that during operation the objective of control can be changed dynamically. This can also be achieved by changing the targeted pulse formation of the switching process.

Possible objectives in the process are:
1) Reduction in the vibrations as a result of existing parasitic elements.
2) Reduction of switching losses
3) Reduction of the EMC spectrum
4) A combination of the points described above with reduced fulfillment of the individual objectives.

This new dynamic makes it possible to react differently for different operating behaviours of the load 2 to be controlled. If, for example, the maximum permissible temperature of the electronics in a hot ambient climate is exceeded, the EMC emission can be increased in favour of temperature reduction in order to secure against a total failure of the system.

In the case of the control described hereinafter, the gate current of the transistor S is applied variably by a suitable switch, proportionality constituting a special case. Proportionality exists between two variable sizes when they are always at the same ratio to each other. Variable generally means a function which can also be described as polynomial.

The gate current for each of the two switching processes consists of a constant current and the described variable portion. Here, the variable portion of the applied gate current is a function of the voltage on the freewheeling diode FD participating in the commutation process of the current each time. In the process the function, as a special case of a polynomial, can be proportional or basically describe a polynomial of a higher order. The switching on and off processes are simply differentiated here by the value of the constant current and by means of the function that transforms the voltage on the associated freewheeling diode into the variable power portion. This means that the gate current generally results thus:

$$i_G(t) = \begin{cases} I_{constON} + f_{ON}(u_{FD}) & \text{switch on} \\ I_{constOFF} + f_{OFF}(u_{FD}) & \text{switch off} \end{cases}$$

This gate current is applied until the gate source voltage reaches the determined limits $U_{GSmax}$ and $U_{GSmin}$. In the process the current can be applied via a closed-loop control or current mirror circuit. If the limits are reached the gate current becomes zero. If the voltage deviates from this, the corresponding gate current is applied again. In the simplest case, the limits are set by the operating voltage of the gate control circuit. The required switching status is specified externally to the control and internally causes a switch between the gate current definitions, which triggers the controlled switching process.

Figure 2:
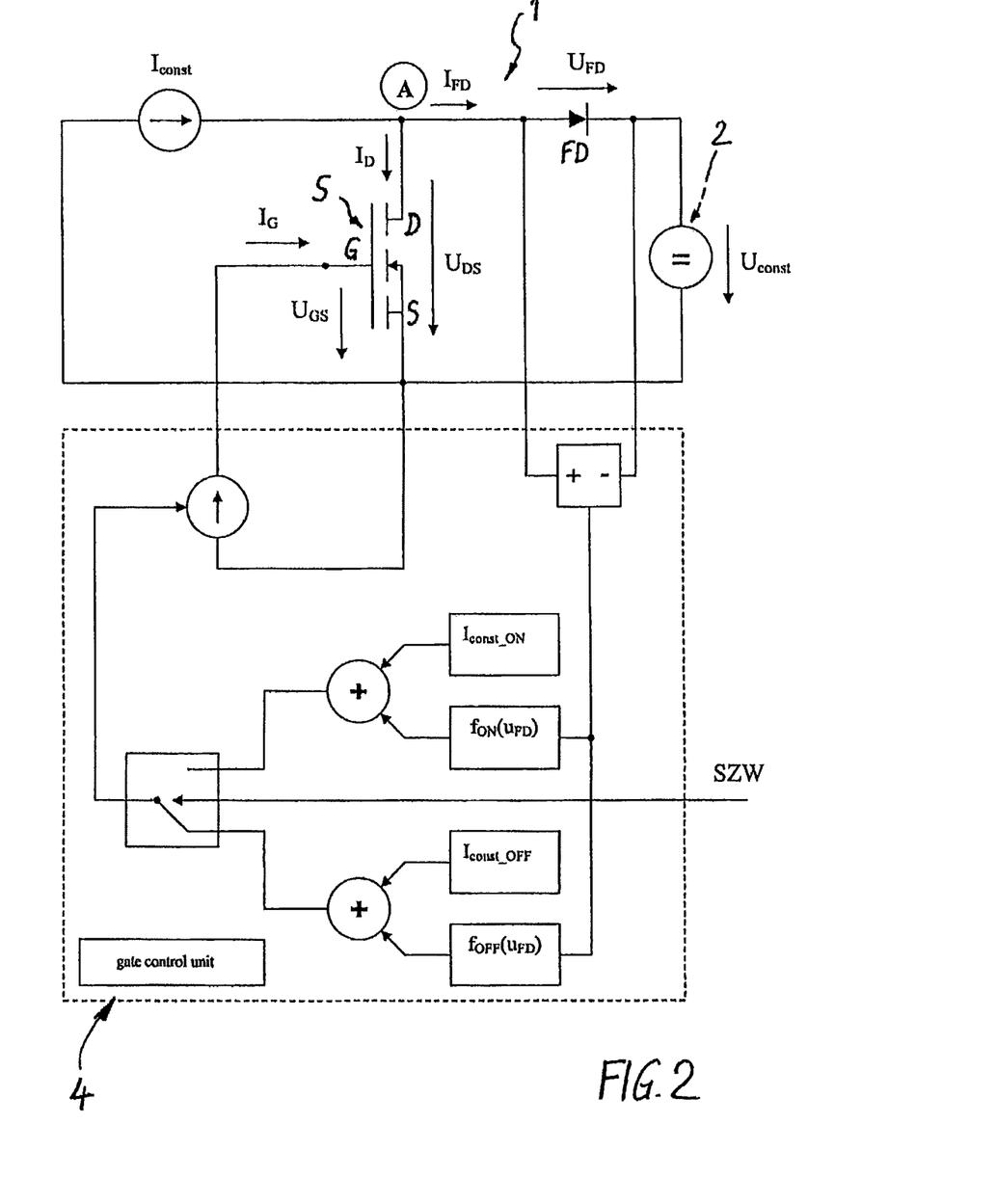
FIG. 2 shows an additional equivalent circuit diagram together with a block diagram of a control circuit according to the disclosure in a first embodiment.

In FIG. 2 a control unit 4 according to the disclosure is shown by way of example in a first embodiment in conjunction with the circuit topology of the switching unit according to FIG. 1.

In the simplest case, the functions of the freewheeling diode voltage constitute a constant weighting factor, i.e.

$$f_{ON}(U_{FD}) = G_{ON} \cdot U_{FD}(t)$$

$$f_{OFF}(U_{FD}) = G_{OFF} \cdot U_{FD}(t)$$

and thus the gate current processes $$i_G(t) = \begin{cases} I_{constON} + G_{ON} \cdot u_{FD}(t) & \text{switch on} \\ I_{constOFF} + G_{OFF} \cdot u_{FD}(t) & \text{switch off} \end{cases}$$

Figure 3:
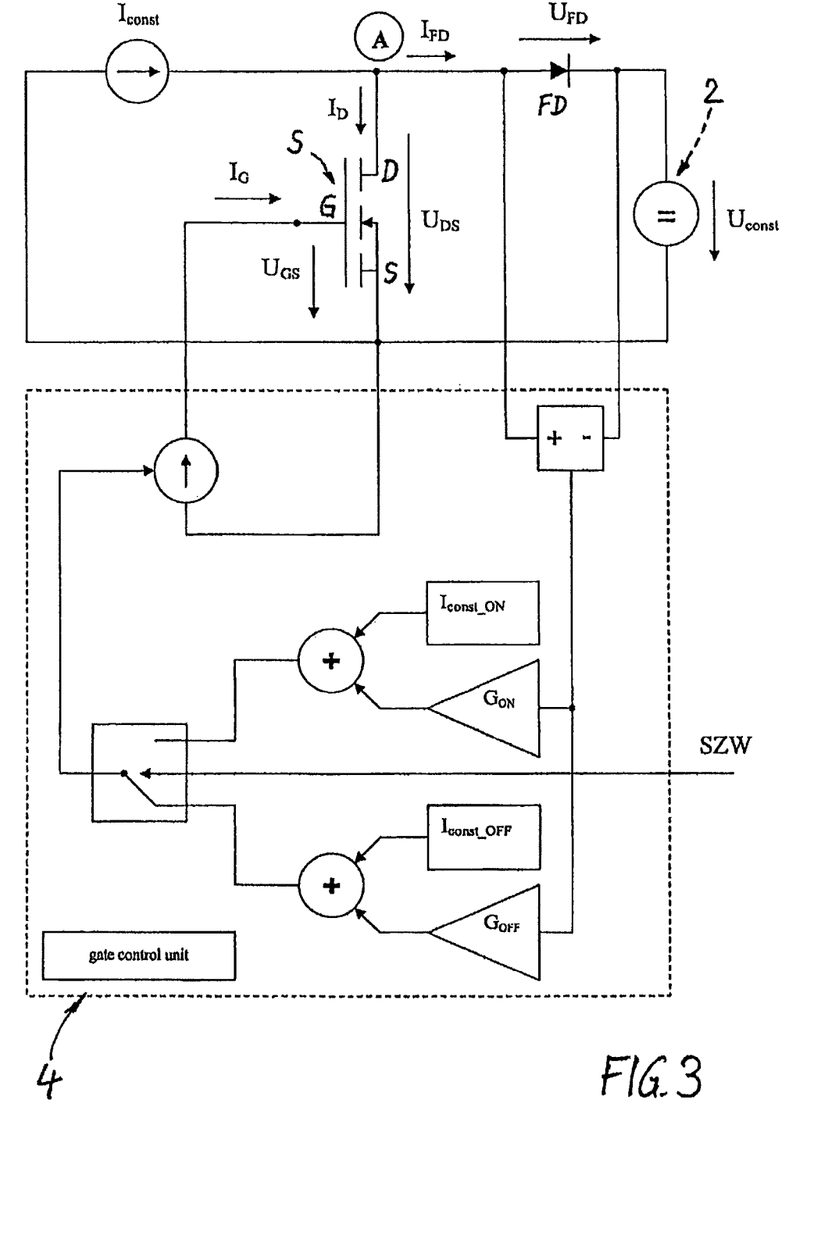
FIG. 3 shows a view similar to FIG. 2 in a second embodiment of the control circuit according to the disclosure, FIG. 4 with the sub

There emerges from this a simplified gate control circuit 4 according to FIG. 3.

By setting the constant currents and weighting factors and their signs accordingly, appropriate pulse shaping can be undertaken. These pulse shapes of the drain source voltage are shown qualitatively in comparison to the switching of a transistor controlled via a purely constant current in FIGS.

4a to 4d. The qualitative adjustments of the respective associated control parameters are listed in the following Table 1.

Qualitative signal processes of the edges are shown by way of example in FIGS. 4a to 4d and specifically each in comparison to the original uninfluenced pulse shapes, shown by a dashed line, e.g. only with gate series resistance.

TABLE 1

| Process acc. To | $I_{const-OFF}$ | $G_{OFF}$ | $I_{const-ON}$ | $G_{ON}$ |
|---|---|---|---|---|
| FIG. 4a | <0, ~0 | <0 | >0, ~0 | >0 |
| FIG. 4b | <0, <$-U_{const}*G_{OFF}$ | >0 | >0, ~0 | >0 |
| FIG. 4c | <0, ~0 | <0 | >0, >$-U_{const}*G_{ON}$ | <0 |
| FIG. 4d | <0, <$-U_{const}*G_{OFF}$ | >0 | >0, >$-U_{const}*G_{ON}$ | <0 |

The following Table 2 describes the respective advantages and disadvantages of the edge modulations depending on an evaluation model:

Every rounding above produces advantages (with + or ++, since only two edges are possible above) but disadvantages in the prevention of the stimulation of parasitic vibrations (with − or −−) in relation to the switching losses. Advantages from the rounding of the edges on the reduction of the EMC interference spectrum are likewise denoted also (with + . . . ++++ since there are four edges).

This evaluation model is now applied to the pulse pattern shown:

TABLE 2

Figure 4A:
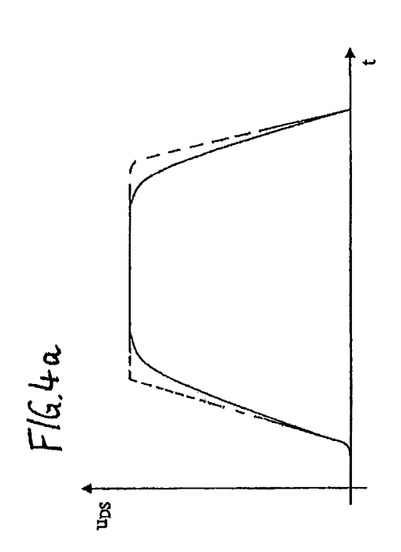
-FIGS. 4a to 4d show diagrams to illustrate the influence on the switch edges by the measures according to the disclosure.
Figure 4B:
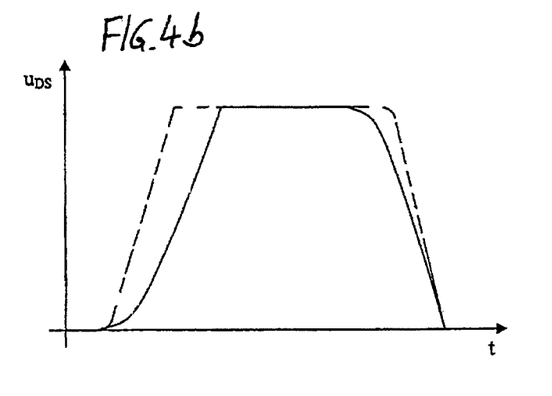
Figure 4C:
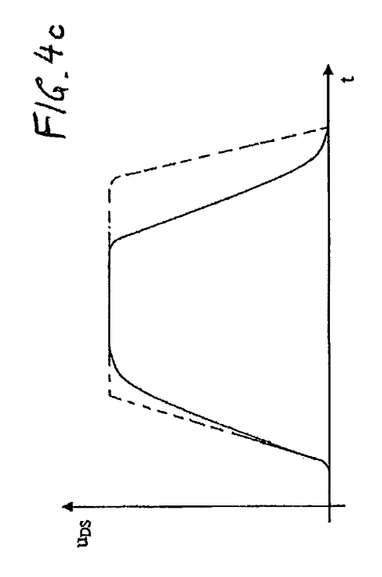
Figure 4D:
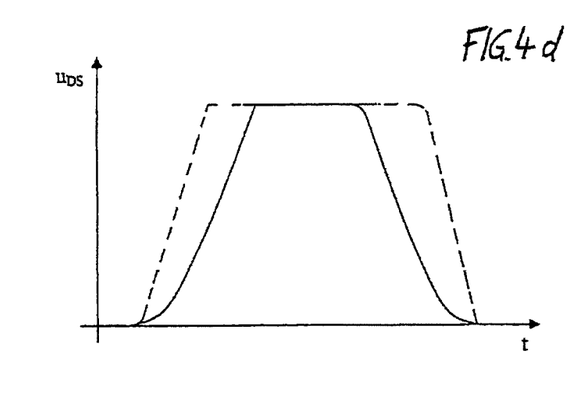
Figure 9:
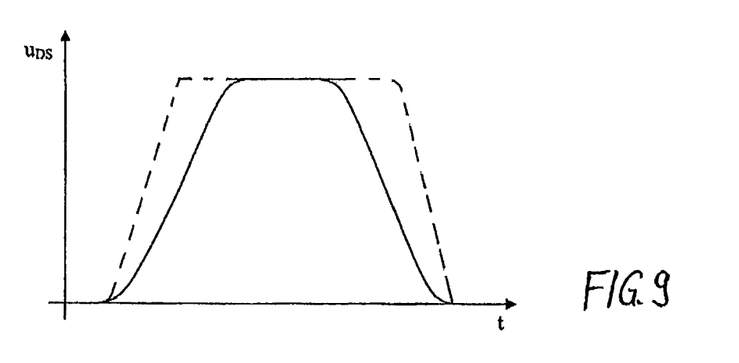
FIG. 9 shows an additional diagram of a switching pulse, FIGS. 10 to 13 each show an additional view similar to FIGS. 2 and 3 in advantageous embodiments.
Figure 14:
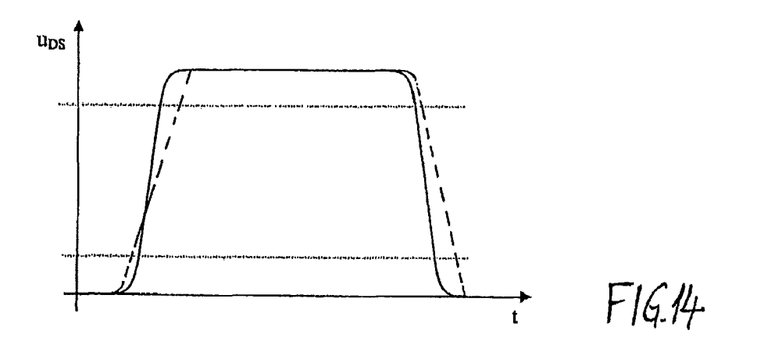
FIG. 14 shows an additional diagram of a possible switch edge modulation.

|  | Reduction of the stimulation of vibrations | Reduction of the EMC spectrum | Increase of power loss |
|---|---|---|---|
| Pulse without rounding | 0 | 0 | 0 |
| FIG. 4a | ++ | ++ | −− |
| FIG. 4b | + | ++ | − |
| FIG. 4c | + | ++ | − |
| FIG. 4d | 0 | ++ | 0 |
| FIG. 9 | ++ | ++++ | −− |
| FIG. 14 | ++ | ++++ | ++ |

Figure 5:
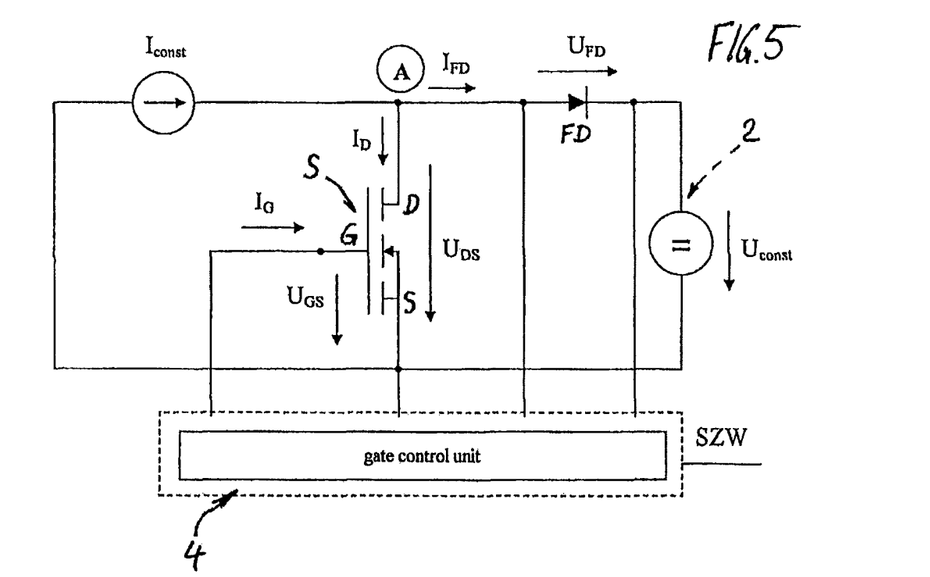
FIGS. 5 and 6 show additional equivalent circuit diagrams of the control circuit.

Description of the Applicability of the Measures According to the Disclosure According to Various Circuit Topologies In principle, the paths modelled as constant current and voltage sources in the circuit topology according to FIG. 5 can constitute any required circuit part, as long as they can approximately emulate a constant current or voltage source at the moment of the switch process and its direct time environment. This means, for example, that the constant current source can be the path of a PFC choke of an active PFC circuit or the connection of a path of a motor winding. Likewise, the voltage source can constitute an emulation of an intermediate circuit of an inverter.

Figure 6:
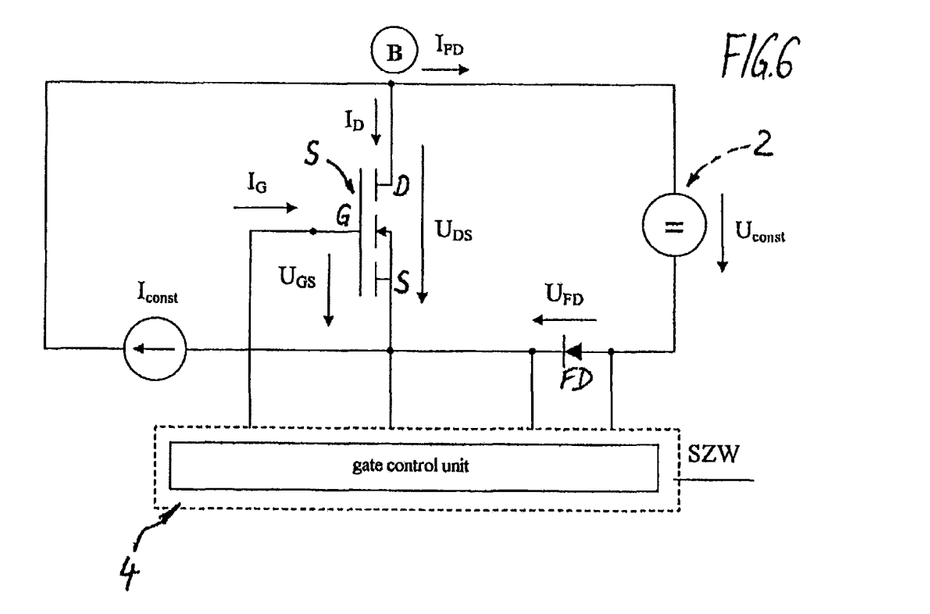

Furthermore, the circuit can be transformed by remodelling into the topology according to FIG. 6, in which the gate control can be used similarly.

Figure 7:
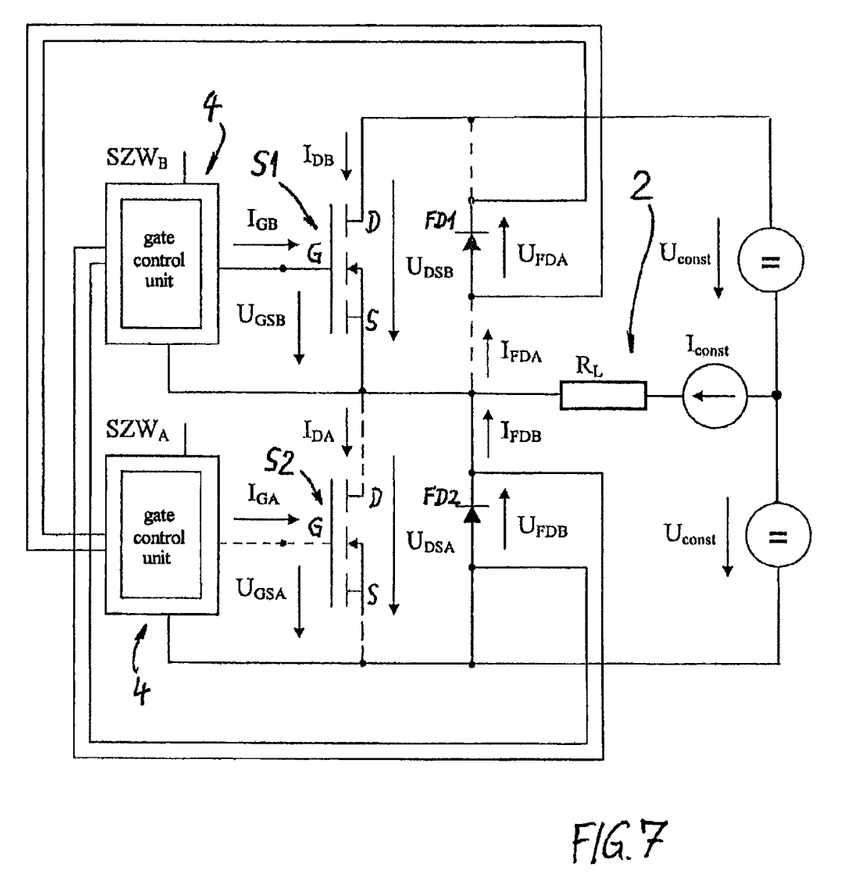
FIG. 7 shows an additional equivalent circuit diagram with two semiconductor switches switched in a partial bridge.

By combining the topologies according to FIG. 5 and FIG. 6, the use of the control circuit in bridge circuits is also possible. This means that a partial bridge comprises two transistors S1, S2 each with an associated freewheeling diode FD1, FD2 parallel to the opposite transistor and two control circuits. This topology is shown in FIG. 7. By combining the partial bridges any required number of inverters for one or more phase can be optimally controlled.

The resistance $R_L$ generally represents a load in the form of $R+u(t)\cdot I_{const}$, it being possible for u(t) to be any required voltage (see the construction of the elementary switching unit in FIG. 1). An inductive portion of the load is taken into consideration by the current $I_{const}$, which emulates the behaviour of inductivity in the switching process. Because of the current flow that is possible due to the topology, the voltage source $U_{const}$ forms the supply while $R_L$ constitutes the load 2.

In order to facilitate a symmetrical view from two switching units, the voltage source $U_{const}$ in FIG. 7 was split into two separate sources. This changes nothing with regard to the behaviour of the switching unit, but moreover does facilitate the symmetrical connection of the load $R_L$.

It can be seen in FIG. 7 that regardless of which freewheeling diode is currently activating which associated switch transistor, the load is always connected in series therewith.

Figure 8:
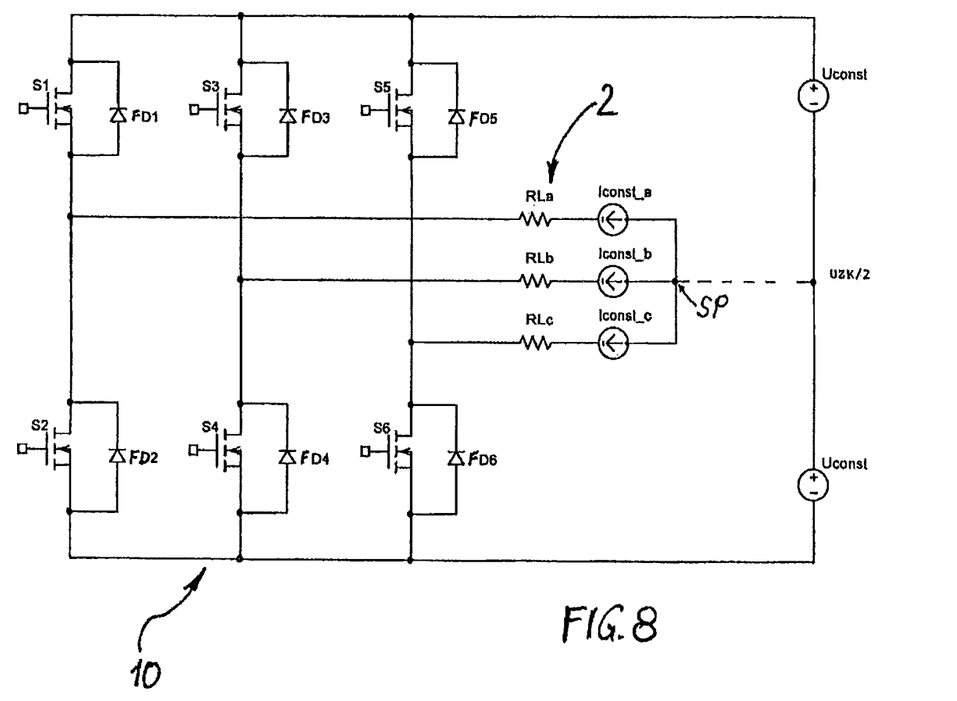
FIG. 8 shows a principal circuit diagram of a three-phase inverter circuit for an EC motor.

For an inverter circuit 10 constructed as a three-phase bridge circuit, a construction according to FIG. 8 thus emerges.

A connection of the star point SP to the point UZK/2 is not necessary in the case of a three-phase bridge, since the respective constant current can flow via the two other phases during commutation.

Also in the case of this bridge circuit, the load and the respective freewheeling diode of one bridge branch are connected in series via the other transistors of the other two bridge branches.

Extension of the Control Model to Measure the Drain Source and Collector Emitter Voltage and the Integration Thereof into the Active Switch Edge Formation By means of an additional measurement of the drain source voltage in addition to the freewheeling diode voltage, an additional degree of freedom is gained in the active switch edge formation. On the one hand all switch edges formed on the basis of the pure freewheeling diode voltage can also be generated via the pure measurement of the drain source voltage. In addition, edges can also be generated with "rounded" shapes on the upper and lower ends due to the now possible combination of both voltages. This can also be achieved in the knowledge of the constant voltage $U_{const}$ via the pure measurement of one of the two voltages, however the edge formation on the basis of a feedback of both signals has a greater independence of parameters.

An edge formation according to FIG. 9, for example, is facilitated with the control model described below.

Figure 10:
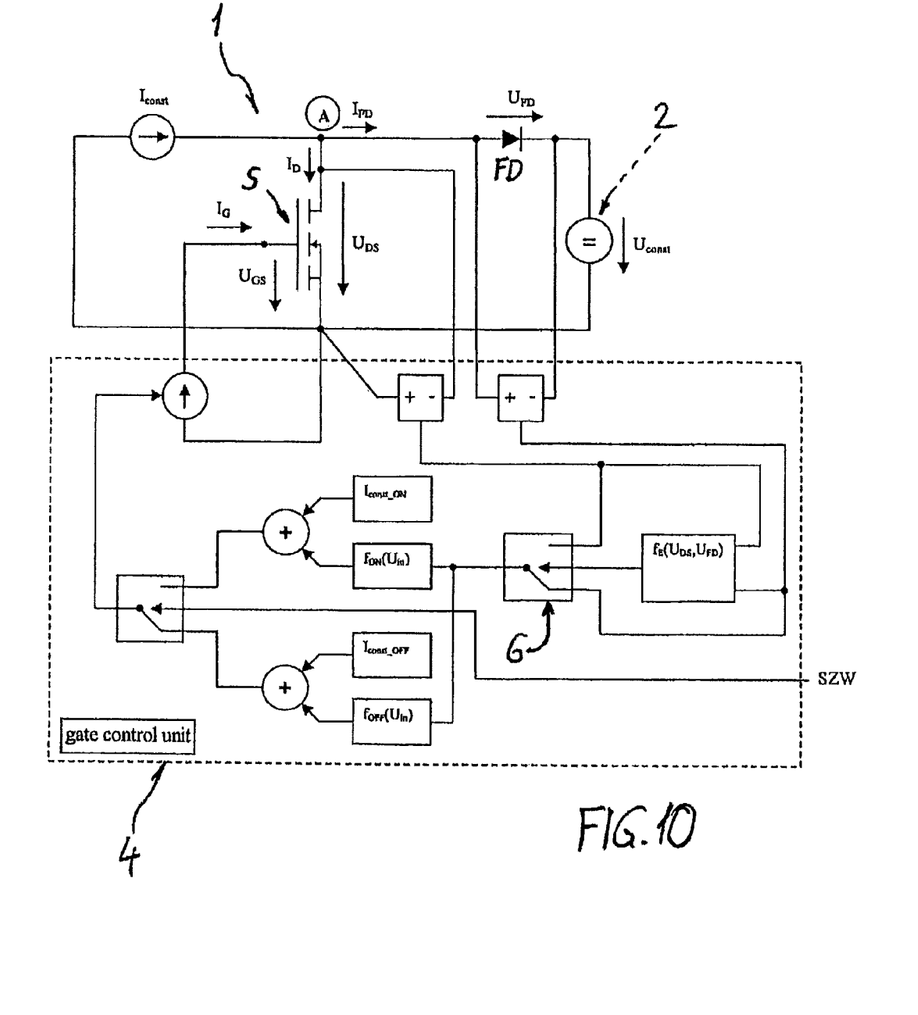

The control model used for this edge formation is shown in FIG. 10. The measurement of the voltage $U_{DS}$ requires an initial gate current in a first switching-on process.

Figure 11:
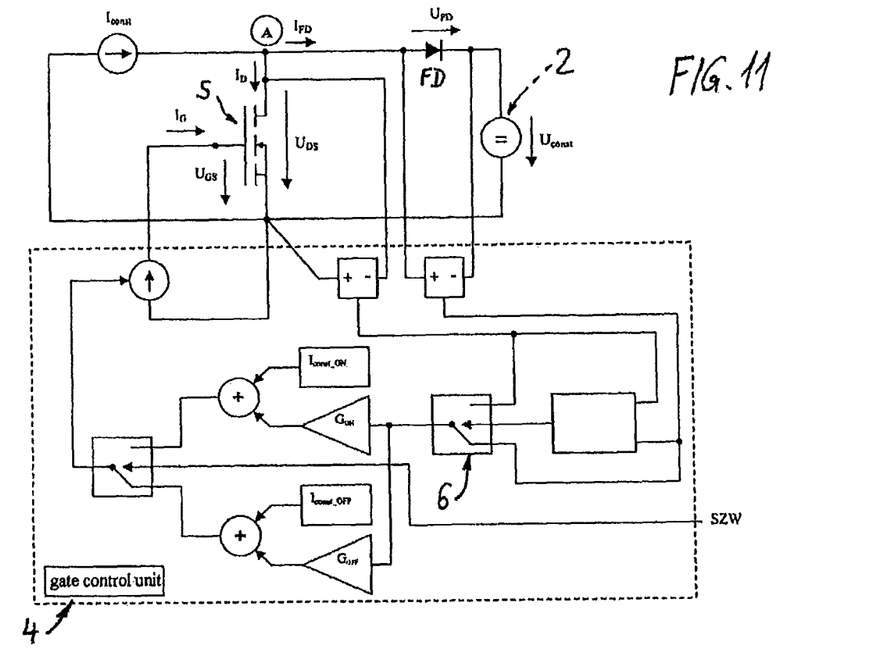

Here, one of the two measured voltages (freewheeling diode voltage, drain source or collector emitter voltage) is now switched to the control topology already shown by means a decision function $f_E$ depending on the voltages to be measured. The decision function here can, for example, switch a switching member 6 as soon as one voltage becomes greater than the respective other one. Likewise, the functions which transform the connected voltage to the variable control current portions can again be weighting factors in the simplest case. Thus, a control model according to FIG. 11 emerges.

In principle, however, just one of the two measures, i.e. control current depending on $U_{FD}$ or $U_{DS}$ can be applied, because an advantageous spectral reduction (dB reduction) can already be achieved by means of each of these measures on its own.

Figure 12:
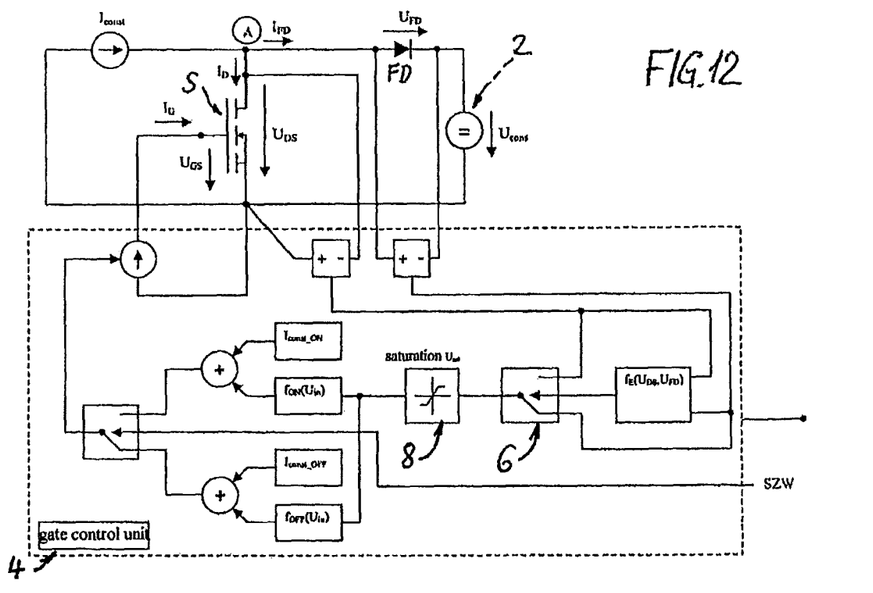
Figure 13:
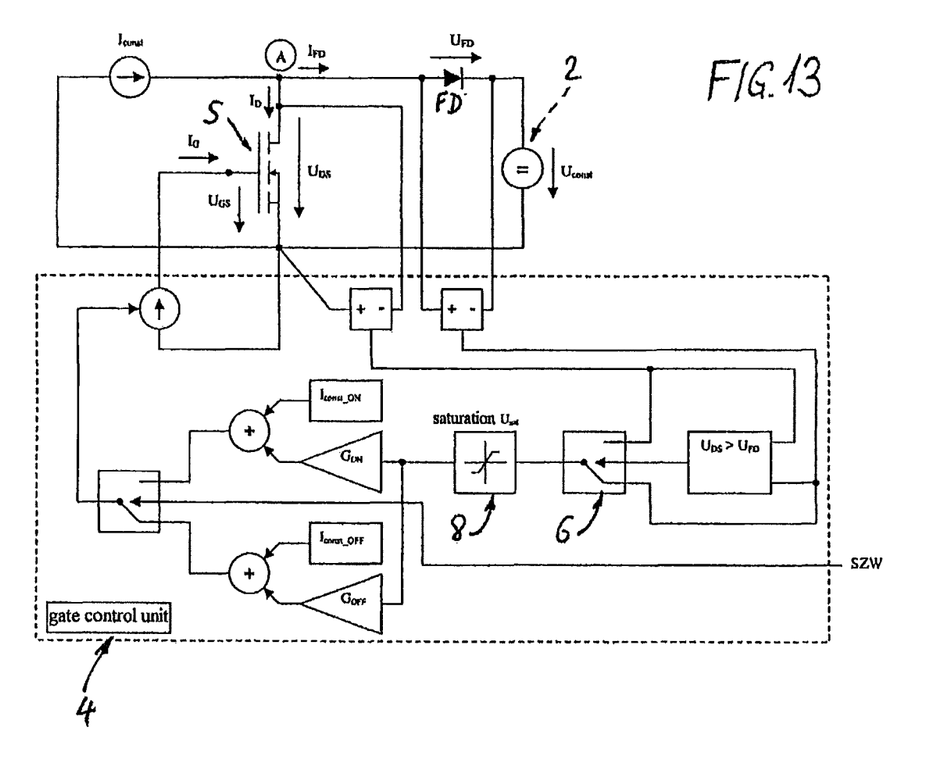

Extension of the Control Model to Include a Saturation Member to Limit the Edge Formation on the Beginning and/or End Portions of the Edges As shown in FIGS. 12 to 14, the edge formation can be restricted to the time intervals when the voltage is smaller on the respective element being measured than the adjusted saturation voltage $U_{sat}$ by introducing a saturation member 8 in the feedback path of the measured voltages. In between or outside of this, the switching is carried out with a gate current gained from a constant voltage $U_{sat}$. The general resulting control model is shown in FIG. 12 and the one for the simplest case with constant weighting functions and a simple decision function is shown in FIG. 13.

As a result of the control circuit extended by the saturation, a faster switching with edge formation limited to the beginnings and ends of the edges is achieved; see for example the edge formation according to FIG. 14.

The disclosure is not restricted to the embodiments shown and described but rather also covers all embodiments producing the same effects within the meaning of the disclosure. It is expressly emphasised that the embodiments are not limited to a combination of all the features but rather each individual sub-feature per se can also have an inventive importance even when detached from all of the other sub-features. Furthermore, the disclosure has so far not been limited either to the combinations of features defined in the respective independent claim, but rather can also be defined by any other required combination of certain features from all of the disclosed separate features. This means that in principle practically any individual feature of the respective independent claim can be omitted or replaced by at least one individual feature disclosed elsewhere in the application. In this respect the claims are simply to be understood to be a first attempt at formulating a disclosure.

The invention claimed is:

1. An electronic circuit comprising
   at least one semiconductor switch, a switching path of which is in series with an inductive load to be controlled,
   at least one freewheeling element that interacts with the semiconductor switch during switching phases and is also in series with the load, and
   a control unit, which controls a control connection of the semiconductor switch with a variable control current as a function of a time profile of a voltage measured at the freewheeling element and as a function of a time profile of a voltage measured at the switching path of the semiconductor switch; wherein
   the control unit measures the voltage at the freewheeling element as well as the voltage at the switching path of the semiconductor switch, the dependence of the control current being switched using a switching member from one voltage of the voltage measured at the freewheeling element and the voltage measured at the switching path of the semiconductor switch to the other voltage of the voltage measured at the freewheeling element and the voltage measured at the switching path of the semiconductor switch during switching phases at a certain ratio of the two measured voltages; and
   during each switching phase the respective measured voltage at the freewheeling element and the semiconductor switch path is compared with a predefined or adjustable saturation voltage, the control current only being variable if the respective measured voltage is lower than the saturation voltage, and the control current otherwise being specified as constant and in particular being gained from a constant voltage, in particular from the saturation voltage.

2. The electronic circuit according to claim 1, wherein a saturation member is arranged in a feedback path of the respective measured voltages.

3. The electronic circuit according to claim 1, wherein the electronic circuit is a constituent part of an electronic inverter circuit, to control EC motors, the inverter circuit consisting of a bridge circuit with at least four semiconductor switches, which are each in pairs with their switch paths in series in bridge paths that are parallel to each other, each load being connected between the semiconductor switches of each bridge path and each semiconductor switch having a parallel-connected freewheeling element, the control unit controlling the control connections of the semiconductor switches such that the load is supplied with a variable operating AC voltage.

4. A method for controlling a semiconductor switch, which is in an electronic circuit with its switching path in series with an inductive load to be controlled and which interacts with a freewheeling element likewise in series with the load during switching phases, the method comprising
   controlling the semiconductor switch to switch with a variable control current as a function of the time profile of the voltage measured at the freewheeling element, and as a function of the time profile of a voltage measured at the switching path of the semiconductor switch; and
   measuring both the voltage at the freewheeling element and the voltage at the switching path of the semiconductor switch wherein
   the dependence of the control current being switched from one voltage of the voltage measured at the freewheeling element and the voltage measured at the switching path of the semiconductor switch to the other voltage of the voltage measured at the freewheeling element and the voltage measured at the switching path of the semiconductor switch during each switching phase at a certain ratio of the two measured voltages; and
   during each switching phase the respective measured voltage at the freewheeling element and the semiconductor switch path is compared with a predefined or adjustable saturation voltage, the control current only being variable if the respective measured voltage is lower than the saturation voltage, and the control current otherwise being specified as constant and in particular being gained from a constant voltage, in particular from the saturation voltage.

5. The method according to claim 4, wherein the variable control current is provided as a sum of a constant portion and a variable portion, the variable portion being a function of the respective measured voltage over the freewheeling element or the semiconductor switching path.

6. The method according to claim 5, wherein at least one of the constant current portion and the variable current portion is different for a switching-on process and for a switching-off process.

7. The method according to claim 5, wherein the function of the variable current portion is proportional and in the simplest case a constant weighting factor.

8. The method according to claim 5, wherein the function of the variable current portion describes a polynomial.

9. The method according claim 4,
comprising an application to control semiconductor switches of a bridge inverter circuit, in particular for operating an EC motor.

\* \* \* \* \*